United States Patent
Rapp

(10) Patent No.: US 9,266,280 B2
(45) Date of Patent: Feb. 23, 2016

(54) METHOD FOR PRODUCING A MICROFLUIDIC DEVICE

(75) Inventor: Manuela Rapp, Filderstadt-Sielmingen (DE)

(73) Assignee: Robert Bosch GmbH, Stuttgart (DE)

( * ) Notice: Subject to any disclaimer, the term of this patent is extended or adjusted under 35 U.S.C. 154(b) by 438 days.

(21) Appl. No.: 13/635,540

(22) PCT Filed: Jan. 21, 2011

(86) PCT No.: PCT/EP2011/050811
§ 371 (c)(1),
(2), (4) Date: Nov. 27, 2012

(87) PCT Pub. No.: WO2011/113630
PCT Pub. Date: Sep. 22, 2011

(65) Prior Publication Data
US 2013/0061961 A1  Mar. 14, 2013

(30) Foreign Application Priority Data

Mar. 18, 2010 (DE) .................... 10 2010 002 991

(51) Int. Cl.
*B29C 65/14* (2006.01)
*B29C 59/02* (2006.01)
(Continued)

(52) U.S. Cl.
CPC ............. *B29C 59/021* (2013.01); *B01L 3/5027* (2013.01); *B01L 3/502707* (2013.01); *B81C 3/001* (2013.01); *B01L 2200/12* (2013.01); *B01L 2300/123* (2013.01); *B01L 2300/163* (2013.01);
(Continued)

(58) Field of Classification Search
CPC . B29C 59/02; B29C 29/021; B01L 3/502707; B01L 3/5027; B81C 3/001
USPC .................... 156/272.2, 272.8, 292
See application file for complete search history.

(56) References Cited

U.S. PATENT DOCUMENTS

| 6,620,478 | B1 | 9/2003 | Öhman |
| 2004/0053237 | A1 | 3/2004 | Liu et al. |
| 2005/0277882 | A1 | 12/2005 | Kriesel |
| 2007/0144599 | A1 | 6/2007 | Bivin |

(Continued)

FOREIGN PATENT DOCUMENTS

| DE | 10 2008 002 336 A1 | 12/2009 |
| DE | 102008002336 A1 * | 12/2009 |

OTHER PUBLICATIONS

International Search Report corresponding to PCT Application No. PCT/EP2011/050811, mailed Nov. 11, 2011 (German and English language document) (5 pages).

*Primary Examiner* — Daniel McNally
(74) *Attorney, Agent, or Firm* — Maginot, Moore & Beck LLP

(57) ABSTRACT

A method for producing a microfluidic device includes the following method steps: a) arranging a thermoplastic elastomeric film between a base substrate and a cover substrate, at least one of the substrates has at least one depression configured to form a microfluidic chamber with a depression opening on the side of the substrate facing the elastomeric film, b) applying pressing power to the arrangement to compress the elastomeric film between the base substrate and the cover substrate, in which process the thickness of the elastomeric film is reduced, c) forming, by laser beam welding, at least one weld joining the thermoplastic elastomeric film, the base substrate and the cover substrate, and d) removing the pressing power to prevent capillaries from forming between the base substrate and the cover substrate.

6 Claims, 2 Drawing Sheets

(51) Int. Cl.
*B01L 3/00* (2006.01)
*B81C 3/00* (2006.01)

(52) U.S. Cl.
CPC ... *B81B 2201/058* (2013.01); *B81B 2203/0315* (2013.01); *B81B 2203/0338* (2013.01); *Y10T 137/85938* (2015.04)

(56) References Cited

U.S. PATENT DOCUMENTS

2008/0108122 A1* 5/2008 Paul et al. ............... 435/183
2011/0076204 A1* 3/2011 Schmidt et al. ........... 422/502

* cited by examiner

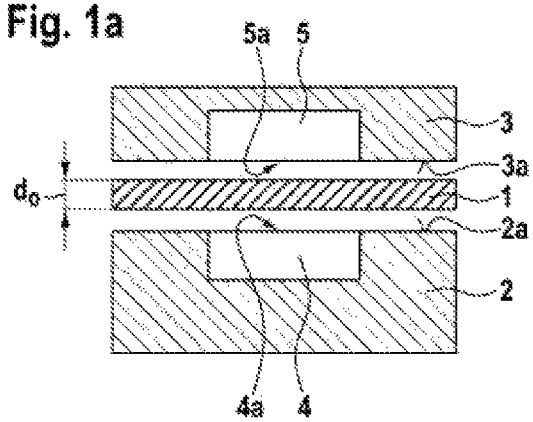
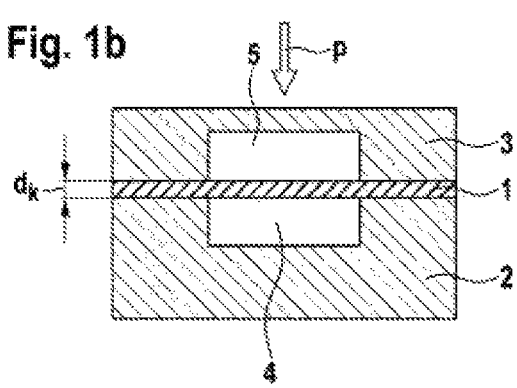
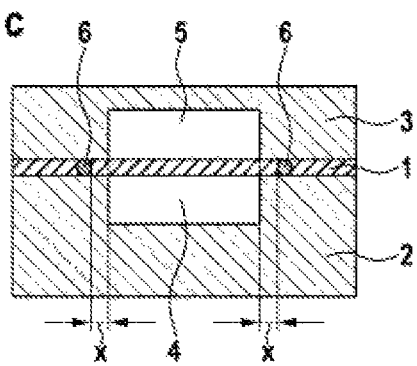

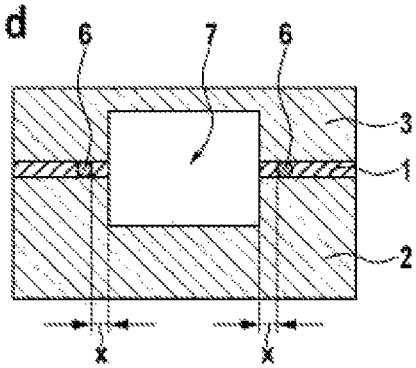
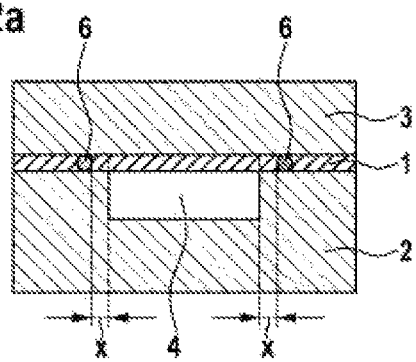
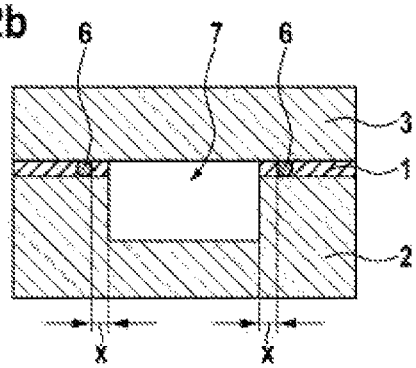

METHOD FOR PRODUCING A MICROFLUIDIC DEVICE

This application is a 35 U.S.C. §371 National Stage Application of PCT/EP2011/050811, filed on Jan. 21, 2011, which claims the benefit of priority to Serial No. DE 10 2010 002 991.2, filed on Mar. 18, 2010 in Germany, the disclosures of which are incorporated herein by reference in their entirety.

The present disclosure relates to a method for producing a microfluidic device and to microfluidic devices.

BACKGROUND

For some years, laser welding has proven to be an attractive joining technique for microfluidic devices made of thermoplastic materials.

This involves, for example, one thermoplastic component, which has a depression acting as a microchannel, incorporating a laser absorber and being welded to another thermoplastic component by exposure to a laser beam. However, for reasons of adjustment, it is not possible to take the weld seam exactly flush along the depression opening. Moreover, the volume of the depression may be changed if the weld seam runs directly along the depression opening.

The publication US 2004/0053237 A1 describes the production of a microfluidic device by arranging a mask layer, which has apertures for forming microchannels, between two substrates and connecting the arrangement by means of laser welding, the weld seam being formed at a distance from the microchannels.

However, a weld seam formed by a conventional method at a distance from the microfluidic chambers may have the effect that capillaries form between the substrates and, if applicable, the mask layer in the region between the weld seam and the microchannels. Capillary formation along a microchannel is problematic, however, for many microfluidic applications.

SUMMARY

The subject matter of the present disclosure is a method for producing a microfluidic device, in particular a microfluidic chip, for example a biochip, comprising the method steps of
a) arranging, in particular arranging in a sandwich-like manner, a thermoplastic elastomer film between a base substrate and a cover substrate,
   at least one of the substrates, that is to say the base substrate and/or the cover substrate, having at least one depression for forming a microfluidic chamber, with a depression opening formed on the side of the substrate that is facing the elastomer film,
b) subjecting the arrangement to a pressing pressure in such a way that the elastomer film is compressed between the base substrate and the cover substrate, while thereby reducing the thickness of the elastomer film,
c) forming by laser welding at least one weld connecting the thermoplastic elastomer film, the base substrate and the cover substrate, and
d) removing the pressing pressure.

When the pressing pressure is removed in method step d), the elastomer film has the tendency to expand and resume the original thickness from method step a). However, the weld has the effect that the base substrate and the cover substrate are fixed at a distance from each other that corresponds substantially to the reduced film thickness from method step b), so that the elastomer film cannot expand to its original thickness. By this effect, the elastomer film serves as a sealant, by which the forming of capillaries between the base substrate and the cover substrate can be advantageously avoided.

For the purposes of the present disclosure, the terms "base substrate" and "cover substrate" serve to distinguish between the two substrates and to describe the arrangement of the substrates in relation to each other, and do not fix the alignment thereof with respect to the direction of gravity.

A microfluidic chamber is, for example, a microchamber, for example a reagent chamber, or a microchannel, for example a fluid channel.

Within the scope of a preferred embodiment of the method according to the disclosure, the weld is formed at a distance from the depression opening. In this way, deforming of the wall of the depression and an accompanying change in volume are advantageously avoided.

Within the scope of a further, preferred embodiment of the method according to the disclosure, the distance between the weld and the depression opening is in a ratio to the thickness of the elastomer film in the uncompressed state in a range from 2:1 to 30:1, for example from 2:1 to 10:1. This has proven to be advantageous for avoiding capillary formation.

For example, the elastomer film in the uncompressed state has a thickness in a range from $\geq 10$ μm to $\leq 300$ μm, for example from $\geq 20$ μm to $\leq 100$ μm, further for example from $\geq 20$ μm to $\leq 50$ μm, and/or in the compressed state has a thickness ($d_k$) in a range from $\geq 2$ μm to $\leq 100$ μm, for example from $\geq 10$ μm to $\leq 30$ μm, and the distance between the weld seam and the depression opening has a value in a range from $\geq 10$ μm to $\leq 500$ μm, for example from $\geq 50$ μm to $\leq 150$ μm.

Within the scope of a further, preferred embodiment of the method according to the disclosure, the elastomer film is compressible by at least 20 percent, in particular at least 50 percent, for example by at least 70 percent, with respect to the thickness of the elastomer film in the uncompressed state. This has likewise proven to be advantageous for avoiding capillary formation.

Within the scope of a further, preferred embodiment of the method according to the disclosure, the pressing pressure has a value in a range from $\geq 5$ N/mm$^2$ to $\leq 500$ N/mm$^2$, for example from $\geq 10$ N/mm$^2$ to $\leq 100$ N/mm$^2$, or from $\geq 10$ N/mm$^2$ to $\leq 50$ N/mm$^2$.

The elastomer film, the base substrate and the cover substrate are preferably formed from a biocompatible material. Biocompatible means here that the material enters into interactions with biochemical analytes and specimens as little as possible, in particular not at all. The base substrate and the cover substrate are preferably formed from a material which does not deform, or not significantly, when the pressing pressure is exerted.

The elastomer film, for example, comprises or is formed from at least one thermoplastic elastomer selected from the group comprising polyolefin elastomers (TPE-O), polyurethane elastomers (TPE-U), polyester elastomers (TPE-E), copolyester elastomers (TPC-ET), styrene elastomers (TPE-S), polyamide elastomers (TPE-A), elastomer vulcanizates (TPE-V), rubber elastomers or mixtures thereof. In particular, the elastomer film comprises or is formed from a thermoplastic elastomer selected from the group comprising polyester urethanes, polyether urethanes and rubber blends. In particular, the polyester urethanes are polyester urethanes that comprise diphenylmethane diisocyanate (MDI), hexamethylene diisocyanate (HDI), dimethyldiphenyl isocyanate (TODI) or mixtures thereof and polyadipate glycols, polycaprolactone glycols, polyoxy tetramethylene glycols, polycarbonate diols or mixtures thereof (as the elastic component). The polyether urethanes are, in particular, polyether urethanes that comprise diphenylmethane diisocyanate (MDI), hexamethylene diisocyanate (HDI), dimethyldiphenyl isocyanate (TODI) or mixtures thereof and polyoxypropylene diols, polyoxytetramethylene diols or mixtures thereof. The rubber blends are, in particular, ethylene-propylene copolymer polypropylene blends (EPM-PP), ethylene-propylene diene-polypropylene blends (EPDM-PP) or mixtures thereof.

The base substrate and/or the cover substrate comprise or are formed from at least one thermoplastic material. For example, the base substrate and/or the cover substrate comprise or are formed from at least one thermoplastic material selected from the group comprising polyolefins, in particular polypropylene (PP), polyethylene (PE) or polystyrene (PS), polycarbonates (PC), poly(meth)acrylates, in particular polymethylmethacrylate (PMMA), cyclo-olefin copolymers (COC) or cyclo-olefin polymers (COP) or mixtures thereof. In particular, the base substrate and/or the cover substrate comprise or are formed from at least one thermoplastic material selected from the group comprising polycarbonates, polyolefins (PP, PE), cycloolefinic polymers, polystyrenes (PS), polymethylmethacrylates (PMMA) and mixtures thereof.

The base substrate and/or the cover substrate, for example, are produced by an injection-molding or hot-embossing process. The depression(s) in this case likewise are produced in the course of the injection-molding or hot-embossing process. However, it is similarly possible to form the depression(s) by an additive process, for example by photolithography, from a base substrate.

The base substrate and/or the cover substrate are in the form of a sheet. For example, the base substrate and/or the cover substrate have a layer thickness of from $\geq 100$ µm to $\leq 5$ mm, in particular from $\geq 300$ µm to $\leq 2$ mm, for example from $\geq 700$ µm to $\leq 1500$ µm.

The depression opening or the depression openings respectively have a surface area of less than or equal to 500 mm². For example, a depression opening has a surface area of from $\geq 0.1$ mm² to $\leq 400$ mm².

In principle, the elastomer film, the base substrate and/or the cover substrate are laser-absorbent. For this purpose, the elastomer film, the base substrate and/or the cover substrate comprise a black pigment and/or some other laser absorber. Suitable, for example, as "other laser absorbers" are substances which absorb a wavelength or a wavelength range that is used in laser welding. Such substances are, for example, "Lumogen" from the BASF company and "Clearweld" from the Clearweld company.

For example,
the base substrate and the cover substrate are laser-transparent and the elastomer film are laser-absorbent, or
the elastomer film and the base substrate are laser-transparent and the cover substrate laser-absorbent, or
the elastomer film and the cover substrate are laser-transparent and the base substrate laser-absorbent.

The elastomer film extends partially or completely over the depression opening. The elastomer film, however, need not extend over the depression opening. This is achieved, for example, by the elastomer film being structured or not structured. For example, the elastomer film is structured by an aperture or a number of apertures.

Within the scope of a further, preferred embodiment of the method according to the disclosure, the elastomer film has at least one aperture in the region of the depression opening. This has the advantage that a material located in the depression is optically or spectroscopically examined better, since the material of the microfluidic device that is radiated through, and consequently the radiation absorption thereof, is reduced.

At the same time, the form and position of the aperture of the elastomer film correspond to the form and position of the depression opening, in particular of the base substrate and/or the cover substrate.

Within the scope of a further, preferred embodiment of the method according to the disclosure, the base substrate has at least one depression for forming a microfluidic chamber, with a depression opening formed on the side of the substrate that is facing the elastomer film, the cover substrate not having a depression opposite the depression opening of the base substrate. This has the advantage that a microfluidic device is producible using easily obtainable components and with little procedural effort, for example as a result of reduced adjustment requirements.

Within the scope of a further, preferred embodiment of the method according to the disclosure, the base substrate and the cover substrate respectively have at least one depression for forming a microfluidic chamber, with a depression opening formed on the side of the substrate that is facing the elastomer film. In particular, the depression opening of the base substrate is formed opposite the depression opening of the cover substrate. In addition, the form and position of the depression opening of the base substrate corresponds in particular to the form and position of the depression opening of the cover substrate and/or the form and position of the aperture of the elastomer film. If the elastomer film does not have an aperture, the arrangement is advantageously used as a valve or as a pump. If the elastomer film has an aperture, this results in a connection between two microfluidic chambers, for example of two microchannels lying in different planes, a material that is located in the chamber as a whole is optically or spectroscopically examined better, since the material of the microfluidic device that is radiated through, and consequently the radiation absorption thereof, is reduced.

The weld may, in particular, is or is formed as a weld seam. For example, the weld, in particular, is or is formed as a weld seam that runs partially or completely around the depression opening, in particular of the base substrate and/or the cover substrate, in particular at a distance.

A further subject matter of the present disclosure is a microfluidic device, in particular a microfluidic chip, for example a biochip, produced by a method according to the disclosure, which comprises a thermoplastic elastomer film, a base substrate and a cover substrate.

In this case, at least one of the substrates, that is to say the base substrate and/or the cover substrate, has at least one depression for forming a microfluidic chamber, with a depression opening formed on the side of the substrate that is facing the elastomer film. The elastomer film is in this case arranged, in particular in a sandwich-like manner, between the base substrate and the cover substrate. The thermoplastic elastomer film, the base substrate and the cover substrate are in this case connected to one another by at least one weld, in particular a laser weld.

The elastomer film preferably has at least one aperture in the region of the depression opening. In this case, the form and position of the aperture of the elastomer film correspond to the form and position of the depression opening, in particular of the base substrate and/or the cover substrate.

For example, the base substrate has at least one depression for forming a microfluidic chamber, with a depression opening formed on the side of the substrate that is facing the elastomer film, the cover substrate not having a depression opposite the depression opening of the base substrate.

However, it is similarly possible that both the base substrate and the cover substrate respectively have at least one depression for forming a microfluidic chamber, with a depression opening formed on the side of the substrate that is facing the elastomer film. In particular, the depression opening of the base substrate are formed opposite the depression opening of the cover substrate. In addition, the form and position of the depression opening of the base substrate correspond to the form and position of the depression opening of the cover substrate and/or the form and position of the aperture of the elastomer film.

With regard to further features and advantages of this microfluidic device according to the disclosure, reference is hereby made explicitly to the features and advantages described in conjunction with the method according to the disclosure.

In addition, a subject matter of the present disclosure is a microfluidic device, in particular a microfluidic chip, for example a biochip, produced for example by a method according to the disclosure, which comprises a thermoplastic elastomer film, a base substrate and a cover substrate. In this case, at least one of the substrates, that is to say the base substrate and/or the cover substrate, has at least one depression configured to form a microfluidic chamber, with a depression opening formed on the side of the substrate that is facing the elastomer film. The elastomer film is in this case arranged, in particular in a sandwich-like manner, between the base substrate and the cover substrate. The thermoplastic elastomer film, the base substrate and the cover substrate are in this case connected to one another by at least one weld, in particular a laser weld. At the same time, the elastomer film has at least one aperture in the region of the depression opening. This has the advantage that a material located in the depression is optically or spectroscopically examined better, since the material of the microfluidic device that is radiated through, and consequently the radiation absorption thereof, is reduced.

In this case, the form and position of the aperture of the elastomer film correspond to the form and position of the depression opening, in particular of the base substrate and/or the cover substrate.

For example, the base substrate has at least one depression for forming a microfluidic chamber, with a depression opening formed on the side of the substrate that is facing the elastomer film, the cover substrate not having a depression opposite the depression opening of the base substrate.

However, it is similarly possible that both the base substrate and the cover substrate respectively have at least one depression for forming a microfluidic chamber, with a depression opening formed on the side of the substrate that is facing the elastomer film. In particular, the depression opening of the base substrate are formed opposite the depression opening of the cover substrate. In addition, the form and position of the depression opening of the base substrate correspond to the form and position of the depression opening of the cover substrate and/or the form and position of the aperture of the elastomer film.

With regard to further features and advantages of this microfluidic device according to the disclosure, reference is hereby made explicitly to the features and advantages described in conjunction with the method according to the disclosure.

Furthermore, a subject matter of the present disclosure is a microfluidic device, in particular a microfluidic chip, for example a biochip, produced for example by a method according to the disclosure, which comprises a thermoplastic elastomer film, a base substrate and a cover substrate. At the same time, the base substrate has at least one depression for forming a microfluidic chamber, with a depression opening formed on the side of the substrate that is facing the elastomer film. In this case, the cover substrate does not have a depression opposite the depression opening of the base substrate. The elastomer film is in this case arranged, in particular in a sandwich-like manner, between the base substrate and the cover substrate. The thermoplastic elastomer film, the base substrate and the cover substrate are in this case connected to one another by at least one weld, in particular a laser weld. This has the advantage that a microfluidic device is produced using easily obtainable components and with little procedural effort, for example as a result of reduced adjustment requirements.

The elastomer film preferably has at least one aperture in the region of the depression opening. In this case, the form and position of the aperture of the elastomer film correspond to the form and position of the depression opening of the base substrate.

With regard to further features and advantages of this microfluidic device according to the disclosure, reference is hereby made explicitly to the features and advantages described in conjunction with the method according to the disclosure.

BRIEF DESCRIPTION OF THE DRAWINGS

Further advantages and advantageous refinements of the subjects according to the disclosure are illustrated by the drawings and are explained in the description which follows. In this, it should be noted that the drawings are only of a descriptive character and are not intended to restrict the disclosure in any form. In the drawings:

FIG. 1a shows a schematic cross section to illustrate method step a);

FIG. 1b shows a schematic cross section to illustrate method step b);

FIG. 1c shows a schematic cross section to illustrate method steps c) and d) and a first embodiment of a microfluidic device according to the disclosure;

FIG. 1d shows a schematic cross section to illustrate a second embodiment of a microfluidic device according to the disclosure;

FIG. 2a shows a schematic cross section to illustrate a third embodiment of a microfluidic device according to the disclosure; and FIG. 2b shows a schematic cross section to illustrate a fourth embodiment of a microfluidic device according to the disclosure.

DETAILED DESCRIPTION

FIG. 1a shows that, within method step a), a thermoplastic elastomer film 1 is arranged in a sandwich-like manner between a base substrate 2 and a cover substrate 3. FIG. 1a shows that the base substrate 2 and the cover substrate 3 in this case respectively have a depression 4, 5 configured to form a microfluidic chamber, with a depression opening 4a, 5a formed on the side 2a, 3a of the substrate 2, 3 that is facing the elastomer film 1. FIG. 1a also shows that the depression opening 4a of the base substrate 2 is formed opposite the depression opening 5a of the cover substrate 5, the form and position of the depression opening 4a of the base substrate 2 corresponding to the form and position of the depression opening 5a of the cover substrate 3. However, it is similarly possible within the scope of the present disclosure that the form and position of the depression opening 4a of the base substrate 2 are different from the form and position of the depression opening 5a of the cover substrate 3 and the form and position of an aperture 7 through the elastomer film 1. In addition, FIG. 1a illustrates that the elastomer film has in the uncompressed state a thickness $d_o$.

FIG. 1b illustrates that, within method step b), the arrangement shown in FIG. 1a from method step a) is subjected to a pressing pressure p in such a way that the elastomer film 1 is compressed between the base substrate 2 and the cover substrate 3, the thickness of the elastomer film being reduced from the thickness $d_o$ in the uncompressed state from method step a) to the thickness $d_k$ in the compressed state in method step b). FIG. 1b also illustrates that the depressions 4, 5 from method step a) together with the elastomer film 1 then respectively form a microfluidic chamber.

FIG. 1c shows that, within method step b), two welds, in particular weld seams, which connect the thermoplastic elastomer film 1, the base substrate 2 and the cover substrate 3, are formed by laser welding. FIG. 1c illustrates that the welds 6 are formed at a distance from the depression opening 4a, 5a, by the distance x. FIG. 1c also illustrates that, after the subsequent removal of the pressing pressure p in method step d), the base substrate and the cover substrate are fixed in relation to each other by the welds 6 at a distance which corresponds substantially to the reduced film thickness $d_k$ from method step b), so that the elastomer film 1 cannot expand to its original thickness $d_o$ in the uncompressed state from method step a), which has the consequence that the elastomer film 1 serves as a sealant and the forming of capillaries between the base substrate 2 and the cover substrate 3 is advantageously avoided. Such a microfluidic device is advantageously used as a valve or pump.

FIG. 1d shows a second embodiment of a microfluidic device according to the disclosure, which differs from the first embodiment, shown in FIG. 1c, substantially in that the elastomer film 1 has an aperture 7 in the region of the depression opening 4, the form and position of the aperture 7 of the elastomer film 1 corresponding to the form and position of the depression opening 4a of the base substrate 2 and/or the form and position of the depression opening 5b of the cover substrate 3. Such a microfluidic device is particularly advantageous for the optical or spectroscopic analysis of substances located therein.

FIG. 2a shows a third embodiment of a microfluidic device according to disclosure, which differs from the first embodiment, shown in FIG. 1c, substantially in that, although the base substrate 2 has a depression 4 configured to form a microfluidic chamber, with a depression opening 4a formed on the side 2a of the substrate 2 that is facing the elastomer film 1, the cover substrate 3 does not have a depression opposite the depression opening 4 of the base substrate 2. Such a microfluidic device is advantageously produced by simple and inexpensive means.

FIG. 2b shows a fourth embodiment of a microfluidic device according to the disclosure, which differs from the third embodiment, shown in FIG. 2a, substantially in that the elastomer film 1 has an aperture 7 in the region of the depression opening 4, the form and position of the aperture 7 of the elastomer film 1 corresponding to the form and position of the depression opening 4a of the base substrate 2 and the form and position of the depression opening 5b of the cover substrate 3. Such a microfluidic device combines the advantages of simple and low-cost production with the advantages of an improved optical or spectroscopic analysis capability.

The invention claimed is:

1. A method for producing a microfluidic device, comprising:
arranging a thermoplastic elastomer film between a base substrate and a cover substrate, at least one of the base substrate and the cover substrate having at least one depression configured to form a microfluidic chamber, the at least one depression having a depression opening formed on a side of the at least one substrate that is facing the thermoplastic elastomer film;
subjecting the arrangement to a pressing pressure to compress the thermoplastic elastomer film between the base substrate and the cover substrate so as to reduce a thickness of the thermoplastic elastomer film,
forming by laser welding at least one weld connecting the thermoplastic elastomer film, the base substrate and the cover substrate, wherein the at least one weld is formed at a distance from the depression opening, and the distance between the at least one weld and the depression opening is in a ratio to the thickness of the thermoplastic elastomer film in an uncompressed state in a range from 2:1 to 30:1; and
removing the pressing pressure.

2. The method of claim 1, wherein subjecting the arrangement to the pressing pressure compresses the thermoplastic elastomer film by at least 20 percent with respect to the thickness of the thermoplastic elastomer film in an uncompressed state.

3. The method of claim 2, wherein the pressing pressure has a value in a range from greater than or equal to 5 $N/mm^2$ to less than or equal to 500 $N/mm^2$.

4. The method of claim 1, wherein the thermoplastic elastomer film has at least one aperture in a region of the depression opening.

5. The method of claim 4, wherein:
the depression opening of the base substrate is formed opposite the depression opening of the cover substrate; and
a form and position of the depression opening of the base substrate corresponds to at least one of a form and position of the depression opening of the cover substrate and a form and position of the at least one aperture of the thermoplastic elastomer film.

6. The method of claim 1, wherein:
the base substrate has at least one depression configured to form a microfluidic chamber;
the at least one depression has a depression opening formed on a side of the base substrate that is facing the thermoplastic elastomer film; and
the cover substrate does not have a depression opposite the depression opening of the base substrate.

* * * * *